(12) United States Patent
Li et al.

(10) Patent No.: US 7,329,617 B2
(45) Date of Patent: Feb. 12, 2008

(54) COATING FOR ENHANCING ADHESION OF MOLDING COMPOUND TO SEMICONDUCTOR DEVICES

(75) Inventors: Jianxiong Li, Hong Kong (CN); Chi Chuen Chaw, Hong Kong (CN); Ngai Kin Tsui, Hong Kong (CN); Deming Liu, Hong Kong (CN); Yiu Fai Kwan, Hong Kong (CN); Wai Chan, Hong Kong (CN)

(73) Assignee: ASM Assembly Automation Ltd., Hong Kong (HK)

( * ) Notice: Subject to any disclaimer, the term of this patent is extended or adjusted under 35 U.S.C. 154(b) by 254 days.

(21) Appl. No.: 11/019,421

(22) Filed: Dec. 22, 2004

(65) Prior Publication Data

US 2006/0131720 A1   Jun. 22, 2006

(51) Int. Cl.
*H01L 21/31* (2006.01)
(52) U.S. Cl. ............... 438/780; 438/758; 438/781; 257/E21.505
(58) Field of Classification Search ............... None
See application file for complete search history.

(56) References Cited

U.S. PATENT DOCUMENTS

| | | | |
|---|---|---|---|
| 3,911,475 A | 10/1975 | Szedon et al. ............... 357/72 |
| 4,428,987 A | 1/1984 | Bell et al. ............... 427/327 |
| 4,946,518 A | 8/1990 | Spanjer et al. ............... 148/282 |
| 5,122,858 A | 6/1992 | Mahulikar et al. ............... 357/70 |
| 5,153,385 A * | 10/1992 | Juskey et al. ............... 174/260 |
| 6,168,872 B1 * | 1/2001 | Ohashi et al. ............... 428/620 |
| 2003/0159773 A1 * | 8/2003 | Tomiyama et al. ............... 156/248 |

FOREIGN PATENT DOCUMENTS

EP   0 690 498 A2   1/1996

OTHER PUBLICATIONS

European Search Report dated Mar. 16, 2006.

\* cited by examiner

*Primary Examiner*—Michael Lebentritt
*Assistant Examiner*—Kyoung Lee
(74) *Attorney, Agent, or Firm*—Ostrolenk, Faber, Gerb & Soffen, LLP

(57) ABSTRACT

A method is provided for enhancing adhesion between a molding compound and a semiconductor device comprising a semiconductor chip attached on a carrier, such as a lead frame, by coating the semiconductor device with a polymer primer prior to molding the semiconductor device. Such coating may be performed by dipping, dripping or spraying the semiconductor device in or with a polymer solution.

21 Claims, 1 Drawing Sheet

COATING FOR ENHANCING ADHESION OF MOLDING COMPOUND TO SEMICONDUCTOR DEVICES

FIELD OF THE INVENTION

The present invention relates to the packaging of electronic devices, and more particularly, to the encapsulation of electronic devices comprising integrated circuit chips together with their carriers, such as lead frames or other substrates.

BACKGROUND AND PRIOR ART

After wafer fabrication, semiconductor chips or integrated circuit (IC) chips have to undergo several steps to be prepared for eventual utilization. After inspection and singulation, individual IC chips are picked up and attached to their carriers, such as lead frames. Then, the respective conductive pads on the IC chips are connected to inner leads of the lead frames through fine conductive wires, forming wire-bonded lead frame assemblies. Afterwards, the wire-bonded lead frame assembly will be encapsulated with a plastic molding compound, and the encapsulated lead frame assembly will further be trimmed, marked and tested before they are mounted to other devices for utilization.

The encapsulants commonly used to encapsulate electronic devices or IC chips are plastic compounds, including epoxy and silicone plastic compounds with fillers up to 80% by weight. The plastic molding compound serves four basic functions: (1) Physically supporting a lead system for electrically connecting the integrated circuit on the chips with an outside component system which will utilize the chip; (2) Protecting the IC chips from contamination, abuse, mechanical damage or breaking; (3) Chemically protecting the chips from environmental hazards, such as moisture, dust and gases that would interfere with the performance of the IC chips; and (4) Providing a thermal path for dissipating the heat generated when the IC chips are functioning. Compared to some other encapsulation technologies, plastic encapsulation has major advantages such as being light in weight, high in fabrication efficiency and low in manufacturing cost.

However, one disadvantage of plastic encapsulation is concerned with its non-hermetic sealing around the encapsulated electronic device or IC chip, which may result in water adsorption by the plastic compounds or moisture permeation through the compounds. This gives rise to a problem commonly associated with current molding compound technology. The problem can be exacerbated by a larger difference in the coefficient of thermal expansion (CTE) between the plastic compounds and carriers like lead frames. As the encapsulated assembly undergoes large and quick temperature changes, thermal stress within the encapsulated body may stimulate fine crazes on the interfaces, especially when the interface bonding is not strong enough. The fine crazes may develop into cracks under conditions of cycling thermal impact. The cracks provide routes for penetration by moisture. Consequently, it is easier for water to enter and accumulate in the encapsulated body. The adsorbed water not only speeds up chemical or metallurgical interaction for some IC chips, but can also lead to device failure in applications or even mounting processes.

For example, the adsorbed or entrained water will flash to steam when the encapsulated lead frame assembly is exposed to rapid heating during component assembly or device use. This will generate a rapid increase in volume locally. The rapid expansion may lead to delamination on three pairs of interfaces: the lead frame/plastic compound interface, the IC chip adhesive/chip attach paddle interface and the IC chip/plastic compound interface. As a consequence of the delamination, the normal IC functions or the connection of IC chips with an outside circuit are disrupted. Internal delamination can also disturb stress and strain distribution within the encapsulated body, which may further result in the fracture of wire-bonded IC chips or disruption of proper heat dissipation paths, and thereby impair the performance of the encapsulated electron devices. In more severe situations, the encapsulated body expands and even ruptures due to rapid hydraulic expansion, especially as the area ratio of carriers to IC chips becomes smaller in modern electronic packages. This phenomenon is normally referred to as "popcorn" in solder welding of encapsulated devices, and occurs more frequently in relation to surface mount assemblies.

Another problem related to plastic encapsulation comes from additives incorporated in encapsulants. The additives include coupling agents, flame-retardants, release agents and others. A commonly used flame-retardant additive in plastic molding compounds for semiconductor packaging are antimony compounds and brominated epoxy. The incorporation of flame retardants in encapsulation compounds is mandated by the fact that some encapsulated electronic devices have in the past generated such heat whereby the flash point of the molding compound was reached and fire ensued. In the event that encapsulant containing this flame-retardant system reaches its flash temperature, antimony compounds and brominated epoxy combine to form antimony tribromide, a dense and heavy flame-retardant gas. The gas prevents the flames from spreading. The adoption of the above-discussed flame retardant materials, as well as other known flame retardant materials, gives rise to another problem with current plastic encapsulation technologies. Some of these flame-retardant chemicals, such as brominated epoxy, when brought into contact with the encapsulated wire-bonded lead frame assembly, tend to degrade the reliability of wire joints. This degradation typically occurs as a result of the flame-retardant causing a degradation or even failure of the intermetallic joints between the bonding wire and at least one of the lead and/or the conductive pad on chips.

To avoid the delamination of plastic molding compounds from lead frames or substrates, many means have been proposed to improve the interfacial bonding. These means include utilizing mechanical interlocks and chemical bonding. Mechanical interlock involves impressions, such as holes, grooves and semi-spheres, being made mechanically on the lead frame, as described in U.S. Pat. No. 4,862,246 entitled "Semiconductor Device Lead Frame with Etched Through Holes" and U.S. Pat. No. 6,501,158 entitled "Structure and Method for Securing a Molding Compound to a Leadframe Paddle". It was claimed that the impressions would increase the surface area of the lead frame and provide crevices for mechanical interlocking. Therefore, the adhesion of lead frames to plastic compounds was enhanced.

In another technique, black oxide has been successfully used for fabrication of printing circuit boards for some time. This technique was transferred to lead frame treatment, such as in U.S. Pat. No. 4,946,518 entitled "Method for Improving the Adhesion of a Plastic Encapsulant to Copper Containing Leadframes". The main thrust of the technique is that the copper on the surface was oxidized in an active oxygen ambient and turned into black cupric oxide. The black cupric oxide has a needle structure on the scale of sub-microns. Thus, the surface area of the lead frame expanded significantly after treatment. Alternatively, by changing reaction conditions or partially converting cupric oxide into cuprous oxide through electric or chemical reduction, a brown oxide may be generated on the surface, as disclosed in U.S. Pat. No. 4,428,987 entitled "Process for Improving Copper-Epoxy Adhesion". It is said that the brown oxide has a finer irregular structure than black oxide.

Coupling agents have also been used for adhesion for a long time. Normally, the coupling agents have two kinds of function groups that can react with substrates and adhesives respectively, so that they provide strong chemical bonding between the substrates and adhesives, such as disclosed in U.S. Pat. No. 6,369,452 entitled "Cap Attach Surface for Improved Adhesion". However, copper-coupling agents may encounter hydrolysis under usual conditions of packaging.

It would be desirable to address the problem of weak bonding between interfaces without causing the degradation of wire joints of the lead frame assembly.

SUMMARY OF THE INVENTION

It is therefore an object of the invention to apply a primer over the lead frame assembly so as to enhance the bonding of plastic molding compounds to lead frames and IC chips.

It is a related object of the invention to seek to enhance the bonding of plastic molding compounds to lead frames and IC chips without affecting the reliability of wire bonds formed therewith.

Accordingly, the present invention provides a method of enhancing adhesion between a molding compound and a semiconductor device comprising a semiconductor chip attached on a carrier prior to molding the semiconductor device, comprising the step of coating the semiconductor device with a polymer primer.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of the preferred embodiment of a method of enhancing the adhesion of encapsulation material in accordance with the invention will now be described with reference to the accompanying drawings, in which.

DETAILED DESCRIPTION OF THE PREFERRED EMBODIMENT

Figure 1:
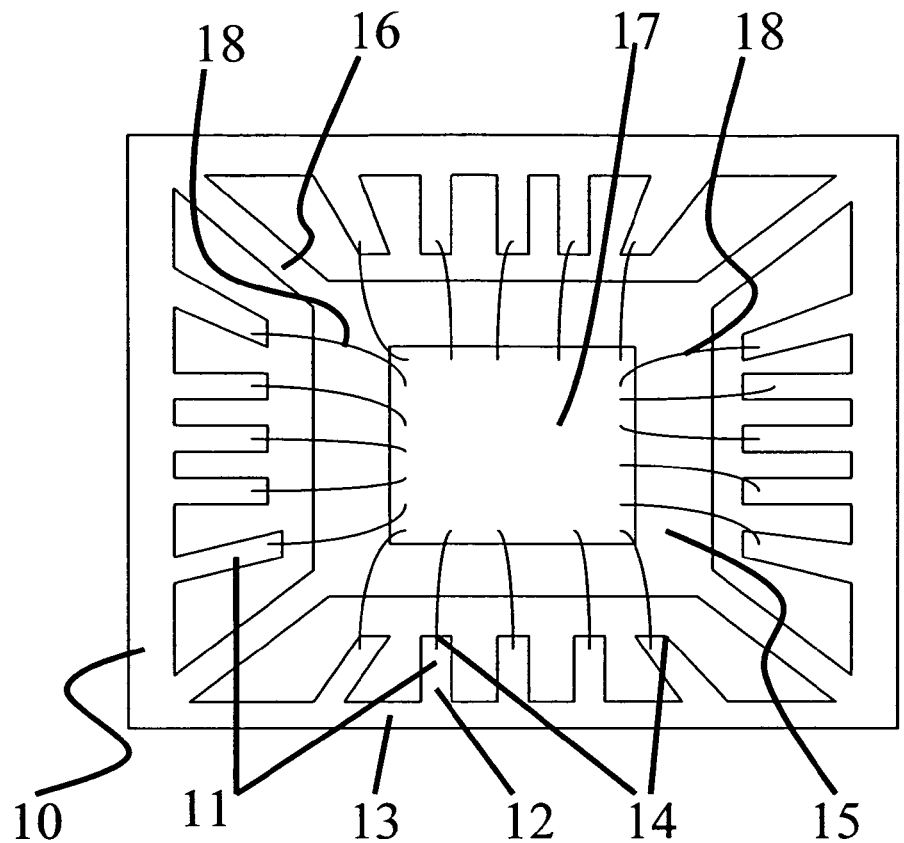
FIG. 1 illustrates a top view of a wire-bonded lead frame assembly.

FIG. 1 illustrates a top view of a semiconductor device comprising a semiconductor chip attached on a carrier, and more particularly, of a wire-bonded lead frame assembly. The carrier is in the form of a quad lead frame 10 and has a plurality of leads 11. The outer portions 12 of the leads 11 are connected to supporting bars 13. The inner ends of the leads form inner leads 14 pointing to the center of the lead frame 10. A die attach paddle 15 is located in the center of the lead frame 10. The die attach paddle 15 is supported by tie bars 16 and provides a site for attaching an electronic device, such as a semiconductor or IC chip 17. The conductive pads on the IC chip 17 are electrically connected to the tips of the inner leads 14 with fine conductive wires 18.

The raw materials for the lead frames are usually copper or copper-based alloys because copper alloys have high electrical and thermal conductivity. Alternatively, other iron/nickel alloys, such as alloy 42, can also be used for the lead frame when the emphasis is on coefficient of thermal expansion or stiffness. On the surface of the lead frame 10, noble metals or alloys, such as Nickel, Silver, Gold and/or Palladium, may be plated, especially on the tips of the inner leads 14 and the die attach pad 15. The lead frame may be fabricated by mechanical stamping or chemical etching. The present invention is suitable for all the lead frames no matter whether they are made from copper based alloys or iron/nickel alloys, fabricated by stamping or etching or are pre-plated or partially plated. The present invention is also suitable for other carriers with a copper surface for holding IC chips.

Figure 2:
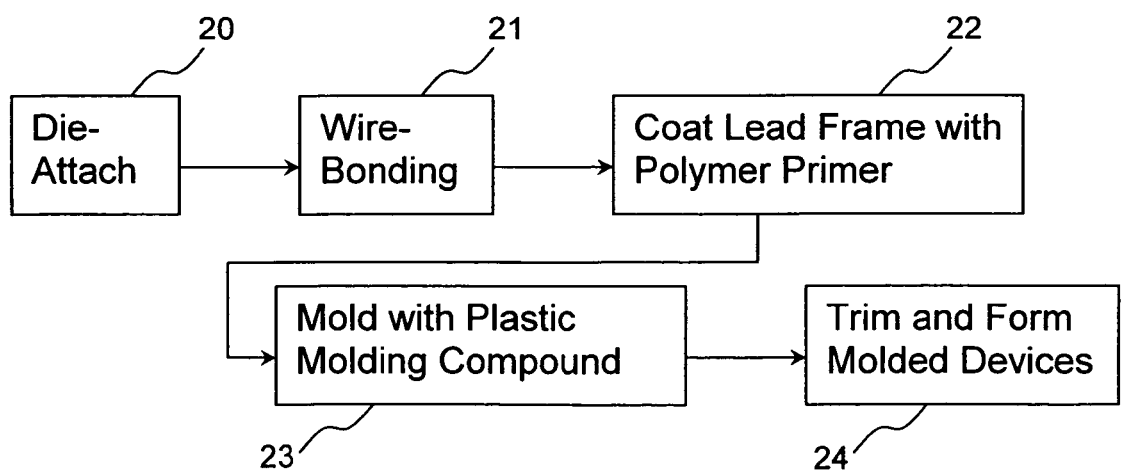
FIG. 2 gives an overview of a packaging process including the application of a polymer primer according to the preferred embodiment of the invention.

FIG. 2 gives an overview of a packaging process including the application of a polymer primer according to the preferred embodiment of the invention. In the fabrication process, the lead frame assembly is processed through several steps. First, during die-attach 20, the IC chip 17 is positioned and fixed onto the die-attach paddle 15. Any conventional solder materials can be used for the die attachment, such as low melting point solders like lead/tin, or eutectic solders like gold/tin and gold/silicon. Alternatively, an organic adhesive, such as silver filled epoxy compounds or bismaleimide compounds, may be adopted to fix the IC chip 17 on the die attach paddle 15. After the IC chip 17 is fixed on the die attach paddle 15, the conductive pads on the IC chip 17 are connected electrically to the tips of inner leads 14 by connecting conductive wires 18 thereto in a wire-bonding process 21. The conductive wires 18 can be made from aluminum, gold or copper. Alternatively, the electrical interconnections between the circuits on the chips and outside circuits can be achieved through solder balls, such as used in ball grid array (BGA) devices. Besides, etched metal foils like copper may also be employed for the electrical interconnection, as those used in tape automated bonding techniques.

Before encapsulation with plastic molding compound, the wire-bonded lead frame assemblies are coated with a polymer primer 22, preferably a polymer solution. The methods to apply the polymer solution can be, without limitation, dropping, dripping or spraying as described below. The polymer coating promotes the bonding of plastic compound to lead frames and IC chips, hence, improves the reliability of the packaged electronic device.

After drying, the next step is to encapsulate the lead frame assembly with plastic molding compound 23. Encapsulation can be performed on transfer molding machines. The molding compounds used widely are based on epoxy resin, such as bisphenol epoxy resin, phenolic novalak epoxy resin and cresol novolak epoxy resin. Normally, the molding compounds are in solid form at ambient temperature but they are adapted to turn into liquid form at elevated temperatures. For encapsulation, the pellets of the molding compound are first inserted into a hot barrel and liquefied in the hot barrel. Meanwhile, lead frame assemblies are placed in heated mold cavities. Then, the liquid compound is forced by a ram into the hot mold cavities and fills the mold cavities. Typically, the inner leads 14, die attach paddle 15 and IC chip 17 are sealed in the molding compound. The liquid molding compound is allowed to solidify and cure in the hot mold. This molding process normally finishes within a couple of minutes. If necessary, the encapsulated assembly can be post cured outside the mold after transfer molding. The encapsulation can also be achieved by dispensing a liquid plastic compound over the electrically-connected semiconductor chips then curing the compound at elevated temperatures. The present invention is suitable for both encapsulation methods.

After molding and curing, each molded electronic package can be trimmed and/or separated from other packages to which it is connected, and formed 24 as appropriate. The electronic packages can further be marked and tested before they are used with other devices.

The primer coating is now described in more detail. A polymeric solution is applied over the lead frame assembly and results in a polymer film formed on the surface of the lead frame assembly. The polymers are able to cross-link to each other after being excited by heat, light or other forms of energy, such as gamma ray, electron beam and plasma. The polymers preferably contain nitrogen in their molecules. The nitrogen-containing polymers are preferably selected from melamine modified phenolic-formaldehyde condensed polymers or resins, acrylic copolymers and benzimidazole copolymers, but are not limited thereto. These polymers are able to combine with copper and noble metals through complex bonds and bond with epoxy molding compound through chemical bonds via drying and curing processes carried out on them. Thus, the bonding force of the molding compound to the lead frames and IC chips is enhanced and the reliability of the packaged electron device is improved. Alternatively, polymers in latex form can be adopted to coat the lead frame assembly.

The aforesaid phenolic resins are preferably produced through a reaction of polyfunctional phenol and aldehydes. The said polyfunctional phenol may comprise one or more of phenol, cresol, bisphenol A, bisphenol F, bisphenol S and/or aliphatic chain phenol. The said aldehyde is preferably formaldehyde, but other aldehydes are also possible. The polymer may comprise monomers or oligomers as these can combine to generate macromolecules though chemical bonds after being excited by heat light or other forms of energy, such as gamma rays, electron beams and plasma.

The polymeric solutions may be made from one single polymer mentioned above or a blend consisting or more than one of the aforementioned polymers dissolved in a solvent. The content of the polymers in the solution can be from 0.01% to 50% by weight, more preferably from 0.1% to 40% by weight, and most preferably from 1.0 to 10% by weight. The solvents are desirably good solvents with respect to the dissolved polymers and do not interfere with the IC chips and pad as well as the wire joints/leads. For melamine modified phenolic resins, the solvent can be water and alcohol, wherein the alcohol preferably includes methanol, ethanol, propanol and/or butanol. For nitrogen containing acrylic copolymer, the solvents may include alcohol, ethers, esters, ketone, alkane and/or cycloalkane. For benzimidazole copolymers, the solvents can comprise dimethyl formamide and/or N-methyl Pyrrolidone. The solvent used to disperse the mentioned polymers can be a single solvent or a mixture of more than one solvent and have a determinable evaporating rate for the solution. The solvent or solvent mixture endows the polymeric primer solutions with low viscosity, avoids dewing on the lead frame assembly and ensures the formation of a uniform polymer film over the lead frame assembly during the drying processes such as coating and baking.

Methods that can be adopted to apply the polymer solution on the lead frame assembly before encapsulation include but are not limited to dropping, dripping and/or spraying. Before coating with polymer solutions, the lead frame assembly may be cleaned with plasma, but that is not essential. The coating process does not impair the performance of the lead frame assembly for encapsulation, trimming and lead finishing. For example, it is not necessary to remove any protective film from the lead frame assemblies, such as the damming films attached to the backside of Quad Flat No-lead ("QFN") frames, before applying the polymer solution.

After applying polymer solution, the wet lead frame assemblies are baked at elevated temperatures in an oven or tunnel. The baking temperature is preferably from 60 to 260° C., more preferably from 100 to 220° C., and most preferably from 160 to 210° C. The baking time is preferably from 1 minute to 30 minutes, more preferably from 2 minutes to 10 minutes, and most preferably from 3 minutes to 5 minutes. After the solvent has evaporated, the applied solution turns into a uniform polymer film over the surface of lead frame as well as on the IC chip(s) and bonding wires. The thickness of the polymer film may range from 10 nm to 0.1 mm, more preferably from 50 nm to 50 µm, and most preferably from 300 nm to 30 µm.

After baking, the lead frame assemblies are ready for encapsulation with plastic compounds and they can be encapsulated as usual with conventional molding methods. For example, a coated lead frame assembly can be encapsulated with epoxy molding compound in a mold at temperatures ranging from 150 to 190° C. and cured in the hot mold for 1 to 3 minutes. If necessary, the encapsulated assembly can be post-cured outside the mold further after transfer molding. The post curing temperature can range from 160° C. to 200° C. The coated polymer film will promote the bonding of epoxy molding compound to the lead frame and IC chip, and hence enhance the reliability of encapsulated electronic devices.

EXAMPLE I

Copper alloy C194 (nominal composition by weight is 97.5% copper, 2.35% iron, 0.12% zinc and 0.07% phosphorous) having dimensions of 58×15×0.2 mm was washed with dichloromethane, ethanol, 10% sodium hydroxide solution and 10% sulfuric acid, and finally rinsed with deionized water and blown with nitrogen gas. Simulating the conditions for die bonding and wire bonding, the washed copper plates were heated in an oven at 150° C. for 60 minutes and then at 230° C. for 3 minutes. Some copper plates with nickel plating and palladium or gold finishing were thermally treated with the same heating profile also. The oxidized specimens were dropped into alcohol solutions that contained different amounts of melamine-phenol-formaldehyde resin. The coated specimens were baked at 180° C. Single-lap joints with lap lengths of 7 mm were made by compression molding the coated copper plates with Sumitomo EME 6650R epoxy molding compound (EMC) at 160° C. for 10 minutes. The lap-shear specimens were post-cured at 175° C. for 4 hours. Lap shear testing was conducted on an Instron material tester at room temperature and a cross-head speed of 1.3 mm/min. Five specimens were tested for each sample and the average was taken as the lap-shear strength of the sample. Table I summarizes the obtained results.

TABLE I

Bonding strength of copper to EMC

| Sample | Primer concentration % | Baking condition ° C. × min | Lap-shear strength MPa | Standard deviation |
|---|---|---|---|---|
| Bare copper | No | No | 2.0 | 0.5 |
| Copper with primer | 0.02 | 180 × 10 | 2.4 | 0.6 |
|  | 0.1 | 180 × 10 | 4.1 | 1.0 |
|  | 0.4 | 180 × 10 | 5.8 | 0.4 |
|  | 2.0 | 180 × 10 | 10.5 | 0.9 |
|  | 5.0 | 180 × 3 | 10.5 | 1.0 |
|  | 10.0 | 180 × 10 | 10.2 | 0.7 |
| Pd finished copper | 5.0 | 180 × 3 | 6.4 | 0.2 |
| Au finished copper | 5.0 | 180 × 3 | 6.5 | 0.7 |

EXAMPLE II

Copper alloy C194 (nominal composition by weight is 97.5% copper, 2.35% iron, 0.12% zinc and 0.07% phosphorous) having dimensions of 30×7×0.2 mm was degreased by immersing in dichloromethane and ethanol, and activated in 10% by weight sulfuric acid at room temperature for 2 minutes. Then the acid-washed copper was rinsed with deionized water and blown with nitrogen gas. After drying, the specimens were dropped into an alcohol solution that contained 10% of melamine-phenol-formaldehyde resin. The coated specimens were baked at 180° C. or 200° C. A molded button with a diameter of 3 mm was formed on each primer coated specimen through transfer molding with Sumitomo EME 6600CS epoxy molding compound (EMC) at a temperature of 175° C. and pressure of 1000 kgf. The copper specimens with the EMC button were post-cured at 175° C. for 4 hours and then preconditioned in 85% RH environment at 85° C. for 168 hours according to JEDEC MSL I. Within two hours after preconditioning, the specimens underwent a reflow heating profile of up to 260° C. The EMC buttons of the heat-treated specimens were shear tested on a Dage-4000 machine and the maximum load to detach the button from substrate was reported. The results obtained are summarized in Table II.

TABLE II

Effect of adhesion primer on button shear loading

| Sample | Primer concentration % | Baking condition ° C. × minutes | Button shear loading N | Standard deviation |
|---|---|---|---|---|
| Bare copper | None | None | 82.0 | 30 |
| Coated Copper I | 10 | 180 × 3 | 213.8 | 40 |
| Coated Copper II | 10 | 200 × 10 | 281.7 | 10 |

EXAMPLE III

To demonstrate the effect of the primer on the adhesion improvement of EMC to noble metals, copper alloy C 194 having dimensions of 30×7×0.2 mm was cleaned and plated with a thin nickel/silver layer. The plated specimens were dropped in alcohol solution that contained 10% of melamine-phenol-formaldehyde resin without further cleaning. The coated specimens were baked at 180° C. for 5 minutes. A molded EMC button with a diameter of 3 mm was built on each primer coated specimen by transfer molding with Sumitomo EME 6600CS EMC at temperature 175° C. and pressure 1000 kgf. The specimens with the EMC button were post-cured at 175° C. for 4 hours and then preconditioned in 85% RH environment at 85° C. for 168 hours according to JEDEC MSL I. Within two hours after the precondition, the specimens underwent a reflowing heating profile of up to 260° C. The EMC button of the heat treated specimens were pushed away from the plated substrate and the maximum load was obtained. Table III summarizes the obtained results.

TABLE III

Effect of primer on adhesion of noble metals to EMC

| Sample | Primer concentration % | Baking condition ° C. × minutes | Button shear loading N | Standard deviation |
|---|---|---|---|---|
| Bare copper | No | No | 82.0 | 30 |
| Ni plated copper | 10 | 180 × 5 | 228.0 | 23 |
| Ag plated copper | 10 | 180 × 5 | 254.1 | 13 |

The results from the above tests and others show that a substantial improvement in the bonding strength between the EMC and lead frame can be achieved by coating the lead frames with a polymer primer before molding with EMC.

The invention described herein is susceptible to variations, modifications and/or additions other than those specifically described and it is to be understood that the invention includes all such variations, modifications and/or additions which fall within the spirit and scope of the above description.

The invention claimed is:

1. Method of enhancing adhesion between a molding compound and a semiconductor device comprising a semiconductor chip attached on a metallic lead frame, comprising the steps of coating the semiconductor device with a polymer primer such that complex bonds are formed between the polymer primer and the semiconductor device and thereafter molding the semiconductor device such that the polymer primer forms chemical bonds with the molding compound for said adhesion enhancement.

2. Method as claimed in claim 1, wherein the semiconductor device includes conductive wire connections formed between the semiconductor chip and the carrier, and the coating step further comprises the step of coating the wire connections with the polymer primer prior to molding.

3. Method as claimed in claim 1, wherein the polymer primer comprises a nitrogen-containing polymer compound.

4. Method as claimed in claim 3, wherein the nitrogen-containing polymer compound is selected from the group consisting of: melamine modified phenolic resin, acrylic copolymer and benzimidazole copolymer.

5. Method as claimed in claim 4, wherein the phenolic resin is produced through a reaction of polyfunctional phenol with aldehydes.

6. Method as claimed in claim 5, wherein the polyfunctional phenol is selected from the group consisting of: phenol, cresol, bisphenol A, bisphenol F, bisphenol S and aliphatic chain phenol.

7. Method as claimed in claim 1, wherein the polymer primer comprises a solution constituted by one or more polymers dissolved in a solvent.

8. Method as claimed in claim 7, wherein the solution comprises 0.01% to 50% of polymer by weight.

9. Method as claimed in claim 8, wherein the solution comprises 1.0% to 10% of polymer by weight.

10. Method as claimed in claim 7, wherein the polymer comprises a melamine modified phenolic resin and the solvent comprises water and alcohol.

11. Method as claimed in claim 10, wherein the alcohol is selected from the group consisting of: methanol, ethanol, propanol and butanol.

12. Method as claimed in claim 7, wherein the polymer comprises an acrylic copolymer and the solvent is selected from the group consisting of: alcohol, ether, ester, ketone, alkane and cycloalkane.

13. Method as claimed in claim 7, wherein the polymer comprises a benzimidazole copolymer and the solvent comprises dimethyl formamide and/or N-methyl Pyrrolidone.

14. Method as claimed in claim 1, wherein the polymer primer comprises polymeric latex.

15. Method as claimed in claim 1, further comprising the step of cleaning the semiconductor device with plasma before coating it with the polymer primer.

16. Method as claimed in claim 1, further comprising the step of baking the semiconductor device at between 60-260° C. for between 1 minute and 30 minutes after the step of coating it with the polymer primer.

17. Method as claimed in claim 16, wherein the semiconductor device is baked at between 160-210° C.

18. Method as claimed in claim 16, wherein the semiconductor device is baked for between 3 minutes and 5 minutes.

19. Method as claimed in claim 1, wherein the thickness of the polymer coating is between 10 nm-0.1 mm.

20. Method as claimed in claim 1, wherein the thickness of the polymer coating is between 300 nm-30 µm.

21. A semiconductor package processed according to the method as claimed in claim 1.

* * * * *